US010505574B2

(12) United States Patent
Kolanski et al.

(10) Patent No.: US 10,505,574 B2
(45) Date of Patent: Dec. 10, 2019

(54) PORTABLE COMMUNICATION SYSTEM HAVING MODULAR COMPONENTS

(71) Applicant: Futurecom Systems Group, ULC, Vaughn (CA)

(72) Inventors: Adam Kolanski, East Gwillmbury (CA); Antonin Bombera, Mississauga (CA)

(73) Assignee: Futurecom Systems Group, ULC, Vaughn (CA)

( * ) Notice: Subject to any disclaimer, the term of this patent is extended or adjusted under 35 U.S.C. 154(b) by 0 days.

(21) Appl. No.: 16/421,079

(22) Filed: May 23, 2019

(65) Prior Publication Data

US 2019/0280726 A1 Sep. 12, 2019

Related U.S. Application Data

(62) Division of application No. 15/698,245, filed on Sep. 7, 2017, now Pat. No. 10,361,737.

(51) Int. Cl.
*H04B 1/56* (2006.01)
*H03H 11/34* (2006.01)
(Continued)

(52) U.S. Cl.
CPC ......... *H04B 1/3827* (2013.01); *H03H 11/344* (2013.01); *H04B 1/3877* (2013.01); *H04B 1/56* (2013.01)

(58) Field of Classification Search
CPC ....... H04B 1/3827; H04B 1/56; H03H 11/344
See application file for complete search history.

(56) References Cited

U.S. PATENT DOCUMENTS 1,584,220 A 5/1926 Farkouh
2,486,536 A 11/1949 Olson
(Continued)

FOREIGN PATENT DOCUMENTS

CA 2736083 A1 9/2012
EP 1916738 A1 4/2008

OTHER PUBLICATIONS

Stratus Lite Repeater, Jun. 2017, 2 pages, Issue 2, 12-20314-EN, Codan Radio Communications.
(Continued)

*Primary Examiner* — David Bilodeau
(74) *Attorney, Agent, or Firm* — Maynard, Cooper & Gale, P.C.; Brian Sattizahn

(57) ABSTRACT

A portable communication system is provided with modular components. The modular components can include internal modules located in a base unit and external modules that can be connected to predefined terminals on the exterior of the base unit. The internal modules can include modules that provide one or more of simplex, half-duplex or full-duplex communication modes. The external modules can include modules that can provide one or more of a full-duplex communication mode or a boost to the power level of the portable communication system. An internal connection can be connected to each of the terminals to provide internal couplings to the terminals. The internal modules can be connected to the external modules by the corresponding internal connections and terminals. The configuration of the portable communication system can be changed by disconnecting the internal modules and/or external modules from the base unit and then connecting new internal modules and/or external modules to the base unit.

16 Claims, 7 Drawing Sheets

(51) Int. Cl.
*H04B 1/3827* (2015.01)
*H04B 1/3877* (2015.01)

(56) References Cited

U.S. PATENT DOCUMENTS

| | | |
|---|---|---|
| 5,533,097 A | 7/1996 | Crane et al. |
| 5,590,022 A | 12/1996 | Harvey |
| 5,903,548 A | 5/1999 | Delamater |
| 6,134,105 A | 10/2000 | Lueker |
| 8,428,573 B2 | 4/2013 | Martz et al. |
| 8,593,358 B2 | 11/2013 | Rappaport |
| 8,594,611 B2 | 11/2013 | Chauhan et al. |
| 8,937,816 B2 | 1/2015 | Trombino |
| 9,026,041 B2 | 5/2015 | Forster |
| 9,293,808 B1 | 3/2016 | Roberts et al. |
| 2007/0232228 A1 | 10/2007 | McKay |
| 2007/0241155 A1 | 10/2007 | Trajkovic et al. |
| 2008/0181282 A1 | 7/2008 | Wala et al. |
| 2012/0068899 A1 | 3/2012 | Ayotte et al. |
| 2019/0074857 A1 | 3/2019 | Kolanski et al. |

OTHER PUBLICATIONS

Stratus Product White Paper P25 & LTE: The best of both worlds, 17 pages, Codan Radio Communications.

PORTABLE COMMUNICATION SYSTEM HAVING MODULAR COMPONENTS

CROSS-REFERENCE TO RELATED APPLICATIONS

This application is a divisional of U.S. application Ser. No. 15/698,245, entitled "Portable Communication System Having Modular Components," filed Sep. 7, 2017, which application is hereby incorporated by reference in their entirety.

BACKGROUND

The present application generally relates to a portable communication system having modular components. More specifically, the present application is directed to a portable digital repeater system that can be configured by connecting different components to a base unit.

Public safety personnel such as first responders, tactical units and/or security teams require frequent communications among group members in order to effectively perform their duties. However, depending on the location and/or circumstances where public safety personnel are needed, traditional fixed RF (radio frequency) coverage areas may not be sufficient to provide for the necessary communications among the group members. When operating in an area with insufficient RF coverage, public safety personnel can use a portable communication system to provide the desired RF coverage and communication capabilities among group members.

Most portable communication systems used by public safety personnel have a fixed configuration and operate most effectively under particular conditions based on the configuration of the portable communication system. However, public safety personnel are required to operate under a variety of different conditions, some of which may not correspond to the optimal conditions for the portable communication system. When operating in less than optimal conditions, the portable communication system may not provide the necessary communication capabilities, which could lead to damage to property and/or injuries to public safety personnel or other people. The portable communication system could be modified for the particular operational conditions encountered by the public safety personnel, but such modifications can be difficult and time consuming due to the fixed configuration of the portable communication system.

SUMMARY

The present application is directed to a portable communication system having modular components. The modular components of the portable communication system can include internal modules located in a base unit and external modules that can be connected to predefined terminals, ports or other connection points on the exterior of the base unit. The portable communication system can be a portable digital repeater system that can be used to provide radio frequency (RF) coverage for a plurality of communication devices, such as 2-way radios, used by personnel in the area. The internal modules can include modules that provide one or more of simplex, half-duplex or duplex communication modes. The external modules can include modules that can provide one or more of a duplex communication mode or a boost to the transmit power level of the portable communication system.

Within the base unit, each of the external terminals can have a corresponding internal connection (e.g., wire or cable) extending from the terminal and ending with a connector or other type of connecting device. The use of an internal connection with a connector can permit an external module to be easily coupled to an internal module, internal connection or other component within the base unit. Further, when a change in the configuration of the portable communication system is needed an external module can be disconnected from the external terminals of the base unit and a new external module can be connected to the same external terminals without having to change the internal connections in the base unit. Depending on the external module that is coupled to the external terminals, the internal connections may have to be disconnected from one internal module, internal connection or component and reconnected to a new (or different) internal module, internal connection or component. Further, internal modules can be exchanged by disconnecting the internal connections coupled to the internal module and reconnecting the internal connections to a new internal module. By providing pre-established internal connections (with connectors) to the external terminals, a user can easily substitute internal modules and/or reconfigure the operation of the base unit as desired.

One advantage of the present application is that it provides reliable, secure RF coverage for communications where needed.

Another advantage of the present application is it can be rapidly deployed to provide local RF coverage.

Still another advantage of the present application is that it can have connectivity to remote dispatch systems.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 1:
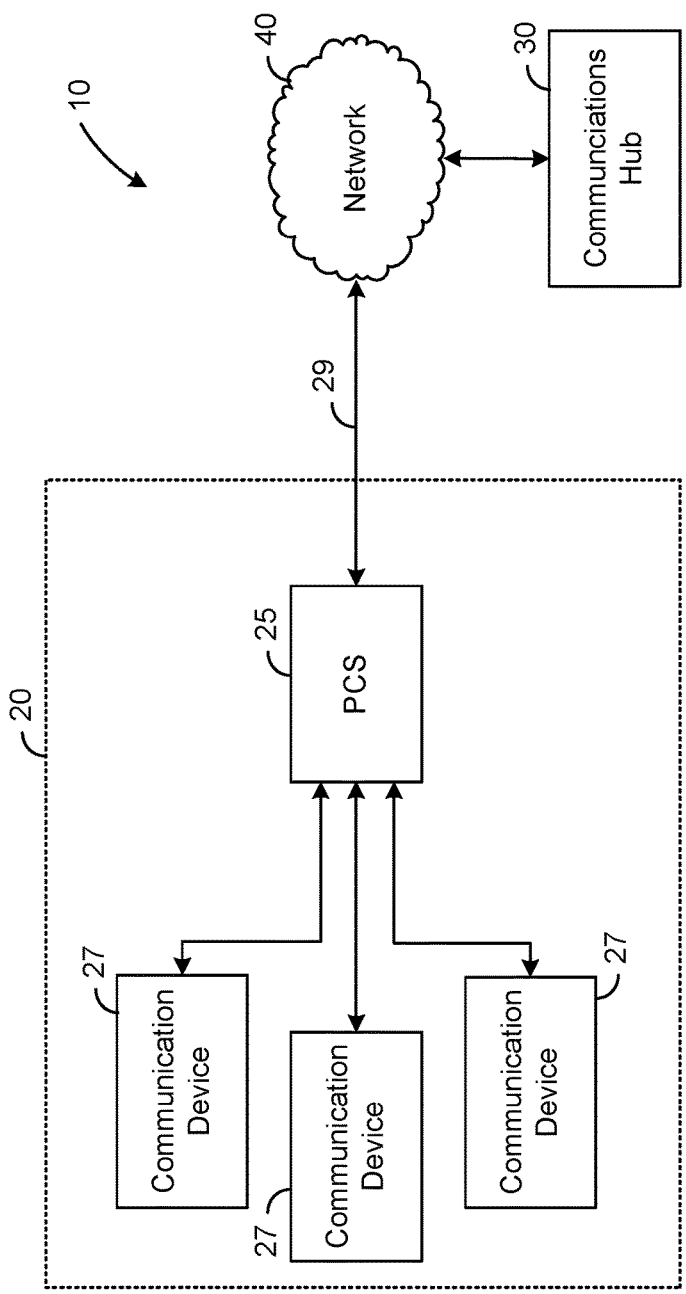
FIGS. 1-2 are block diagrams showing embodiments of communication networks.

FIG. 1 shows an embodiment of a communication network 10. The network 10 can include a local network 20 in communication with a communications hub 30 via a network 40. In one embodiment, the network 40 can be a public switched telephone network (PSTN). However, in other embodiments the network 40 can be the Internet and use the transmission control protocol/Internet protocol (TCP/IP) for communication, a cellular network, a local area network (LAN), a wide area network (WAN) or any other type of communication network using one or more communication protocols.

The local network 20 can have one or more portable communication system (PCS) 25 and a plurality of communication devices 27 in communication with the PCS 25 using RF (radio frequency) communications. However, in other embodiments, other frequencies (e.g., infrared frequencies) can be used for communications. The PCS 25 can communicate with communication devices 27 using any suitable RF channel, band or frequency such as a VHF (very high frequency) band (e.g., 136 MHz to 174 MHz), a UHF (ultra high frequency) band (e.g., 380 MHz to 430 MHz, 450 MHz to 470 MHz, or 470 MHz to 512 MHz), a 700 MHz band (e.g., 764 MHz to 776 MHz or 794 MHz to 806 MHz) or an 800 MHz band (e.g., 806 MHz to 824 MHz or 851 MHz to 869 MHz). In addition, the transmissions between the PCS 25 and the communication devices 27 can use the Project 25 (P25) Common Air Interface (CAI) standard that specifies the type and content of signals transmitted by the communication devices 27 for digital radio communications. The P25 standard can be used by public services personnel to communicate with each other during emergency situations and in the course of performing their duties. However, in other embodiments, the communications between the communication devices 27 and the PCS 25 can use other suitable standards or communication protocols. In an embodiment, the communication devices 27 can be 2-way radios configured to communicate with the PCS 25. However, in other embodiments, the communication devices 27 can be any device capable of RF communications such as smartphones, tablet computers and laptop computers. In an embodiment, the PCS 25 can be connected to the network 40 (and the communications hub 30) using an interface 29. In one embodiment, the interface 29 can be a V.24 wireline interface (an ITU standard that defines the functions of all circuits for the RS-232 interface). However, in other embodiments, the interface 29 can use other wired or wireless interfaces to connect the PCS 25 and the network 40.

The communications hub 30 can be located at a remote location from the local network 20 and can include a system infrastructure such that fixed-end equipment (e.g., data interfaces such as conventional channel gateway (CCGW) or digital unit interface (DIU), consoles, voting/comparator system, etc.) and data/software applications (e.g., dispatch applications, location services applications, safety applications, security applications, etc.) at the communication hub 30 can have access to and communicate with the local network 20 and the communication device 27. In one embodiment, the communications hub 30 can use a digital communication system such as ASTRO® 25 by Motorola Solutions.

In one embodiment, the PCS system 25 can be used for several different operations such as a wireline repeater and base station, a back to back cross band repeater (RT/RT), a standalone repeater and a wireline satellite transmitter or repeater. When used as a wireline repeater and base station, the PCS 25 can be connected to the communications hub 30 by network 40 as shown in FIG. 1 to provide the communications hub 30 access to digital conventional RF channels in local network 20 and support most digital conventional services and site features provided by the communications hub 30.

Figure 2:
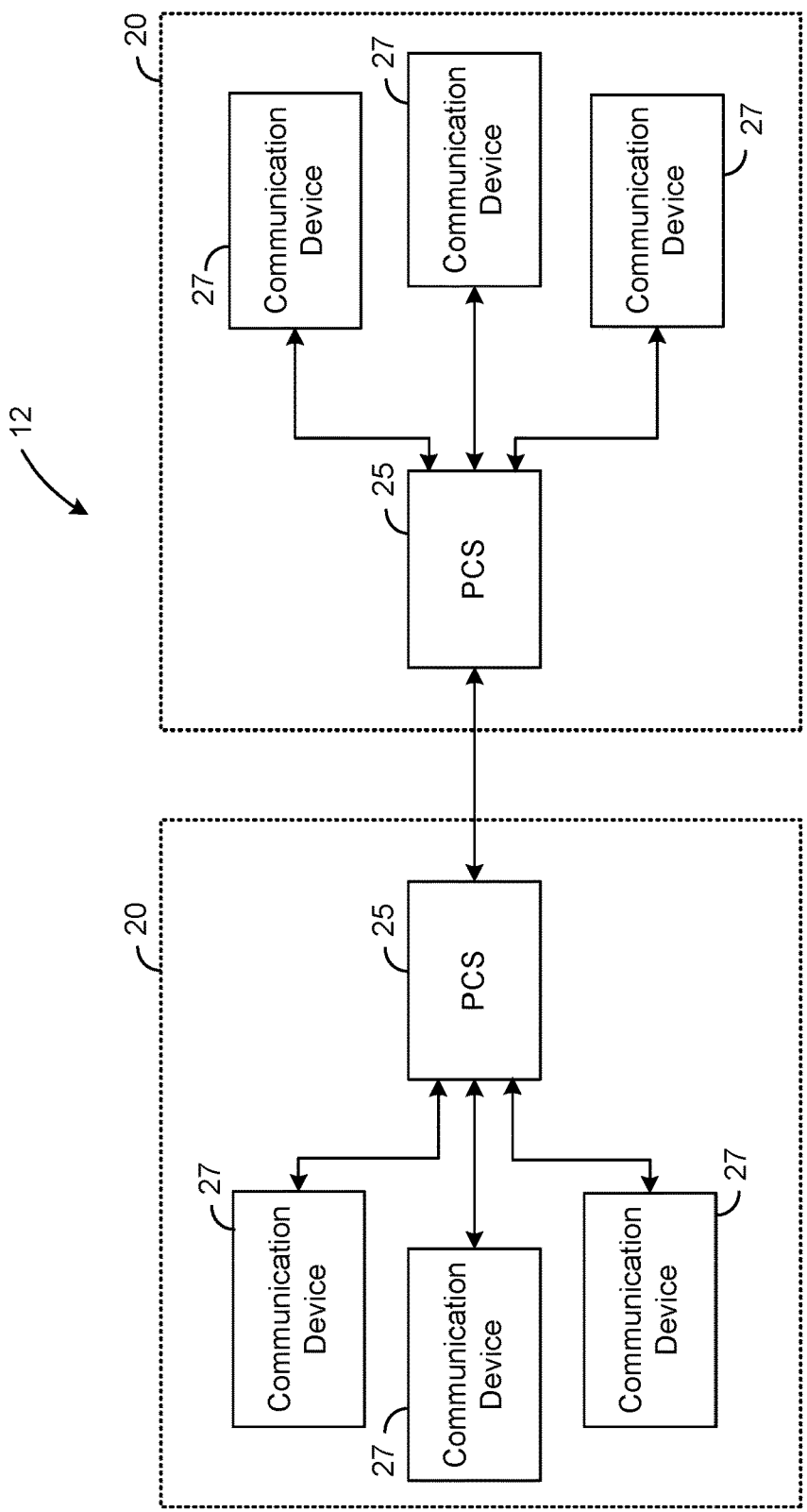

In another operation, the PCS system 25 can be used as a back to back cross band repeater in a communication network 12 to relay signals from one PCS system 25 to another PCS system 25 as shown in FIG. 2. The communication network 12 can be used to provide for the conversion of frequency bands used in local networks 20. In still another embodiment, the PCS system 25 can be used as a standalone repeater to provide full-duplex, local repeat capabilities on the configured channel of the local network 20. For example, the PCS system 25 can repeat one or more of voice, supplementary data services or packet data services between communication devices 27 in local network 20. When used as a standalone repeater, the PCS system is not connected to the network 40 or communications hub 30.

In a further operation, the PCS system 25 can be used as wireline satellite receiver/transmitter to provide receive-only or transmit-only capabilities to the local network 20. For example, the PCS system 25 can be used as part of a voting/comparator system to provide an improved RF coverage solution for local network 20. Voting solutions can employ multiple receivers and a single transmitter. When used as part of a voting solution, the PCS 25 can serve as one of the satellite receivers to provide receive-only operation for the local network 20 and permit the comparator and a separate transmitter located at the communications hub 30 to provide the transmit operations. In an embodiment, other coverage scenarios for local network 20 may result in one PCS system 25 used as a receiver, and another PCS system 25 in a different location used as a transmitter.

In one embodiment, the functional behavior of the PCS system 25 and the communication channels used by the PCS system 25 can be defined by a multi-level set of configuration parameters. The configuration parameters can be modified using a service/configuration software tool. In one embodiment, the service/configuration software tool can be executed at the communications hub 30 and corresponding information and instructions communicated to the PCS system 25 via network 40. In another embodiment, the service/configuration software tool can be executed at the PCS system 25.

Depending on the parameters selected, the PCS system 25 can be configured for a range of operational scenarios. The high-level categories of configuration parameters can include platform configurations, RF configurations and channel configurations. In one embodiment, the configuration/service software tool can be a software application executed by a microprocessor that permits a technician to configure the PCS system 25 for different uses and provide diagnostic capabilities such as technician-viewable reports and logs.

The platform configurations can include a PDR (Portable Digital Repeater) mode, a satellite receiver mode and a satellite transmitter mode. In one embodiment, the platform configuration can be selected with a single configuration parameter allowing it to operate in the selected platform mode. The selection of the platform mode may limit the available options when selecting the RF configurations and the channel configurations such that inoperable configurations for the PCS system 25 are not available. When the PDR mode is selected, the PCS system 25 can operate as a PDR and can provide RF receive and transmit functionality. In addition, operation in the PDR mode permits the PCS system 25 to support the interface 29 to the network 40 and the communications hub 30. Depending on the RF configurations and the channel configurations selected with the PDR mode the various transmit/receive/wireline behaviors can be configured to provide desired operation to the PCS system 25.

When satellite receiver mode is selected as the platform configuration, the PCS system 25 can receive transmissions from the communication devices 27 via the RF channel used for the local network 20, and deliver information to the network 40 and the communications hub 30 via the interface 29. The PCS system 25 cannot transmit to the communication device 27 via the RF channel when operating in the satellite receiver mode and the PCS system 25 can ignore any requests received from the interface 29 to transmit a payload. The PCS system 25 can continue to service the interface 29 and execute commands that do not call for RF transmit activity. The satellite receiver mode can be used when receive-only functionality is required, or when the PCS system 25 is deployed as part of a voting system, where multiple devices work together to provide the total set of functionality needed for 2-way radio communications.

Another potential use for the satellite receiver mode is in connecting two PCS system 25 together in a back-to-back configuration as shown in FIG. 2, but only enabling one of the PCS systems 25 to repeat/transmit. The back-to-back configuration with one PCS system 25 in satellite receive mode permits the RF receive coverage area for the communication devices 25 to be increased to the region covered by both PCS systems 25 (i.e., the areas covered by the local networks 20 for each of the PCS systems 25), and utilizes one PCS system 25 as the single transmitter to serve the entire combined area.

When satellite transmitter mode is selected as the platform configuration, the PCS system 25 can receive information from the communications hub 30 via the network 40 and interface 29, and transmit the information to the communication devices 29 via the RF channel for the local network 20. The PCS system 25 cannot receive transmissions from the communication devices 27 when operating in the satellite transmitter mode because any received transmissions are ignored by the PCS system 25. The satellite transmitter mode can be used when irregular terrain or coverage patterns require transmit and receive functions to be separated to different PCS systems 25. One example for using the satellite transmitter mode is when PCS systems 25 are used as separate transmitters and receivers as part of a voting system, where multiple devices work together to provide the functionality needed for 2-way radio communications.

The RF configurations can include a repeater mode and a base station mode. In one embodiment, the RF configuration can be selected with a single configuration parameter allowing it to operate in the selected RF mode. Repeater mode operation can support only full-duplex channels, as described below, and base station mode can be used with either half-duplex channels, as described below, or full-duplex channels. In one embodiment, if a PCS system 25 is configured with a combination of half-duplex and full-duplex channels, then only those channels consistent with the current RF configuration are enabled and available for use. The disabling of certain channels based on the current RF configuration permits a system technician to program a combination of different channel types (e.g., half-duplex or full-duplex) into a PCS system 25, and then selectively enable/disable many of the channel types all at once by reprogramming the RF configuration parameter, effectively disabling the channels that are incompatible with the chosen RF configuration.

When repeater mode is selected as the RF configuration, the PCS system 25 can simultaneously send and receive voice, data and supplementary data transmissions and/or services between the communication devices 27 and the interface 29. The PCS system 25 also has the ability to retransmit information received via a communication device 27, back over the RF channel to other communication devices 27. The ability to retransmit data from a communication device back over the RF channel to other communication devices 27 is why repeater mode operation is only compatible with channels configured for full-duplex (i.e., simultaneous transmit and receive) operation. By operating the PCS system 25 in repeater mode, communication device transmissions can be delivered to a larger geographical area than the individual communication devices 27 could reach directly. Transmissions from a communication device 27 are received at the PCS system 25 (operating in repeater mode), and then rebroadcast to the entire local network 20 (i.e., the coverage area of the transmitter of the PCS system 25).

The retransmission of received transmissions by the PCS system 25 (a.k.a., local repeat) can be controlled in a variety of ways. The communications hub 30 can control the PCS system 25 to activate or deactivate its local repeat functionality by sending a command to the PCS system 25 via network 40 and interface 29. The command itself (e.g., repeat enable or repeat knockdown (or disable)) indicates the desired behavior of the PCS system 25. If the communications hub 30 sends the PCS system 25 a repeat knockdown command, the communication devices 27 are prevented from receiving transmissions from each other. The prevention of local repeat capabilities can be a temporary situation, and communications hub 30 can re-enable repeat operation when desired by sending the repeat enable command. The PCS system's initial/power-on state for local repeat can be configurable via the service/configuration software tool, and can be set to start the PCS system with local repeat enabled, local repeat disabled, or revert to the state previously requested by the communications hub 30, which can be locally cached within the PCS system 25. In one embodiment, the PCS system 25 can be configured to automatically activate repeat mode in the case of certain system outages, which can be referred to as fallback incabinet repeat.

In one embodiment, when the PCS system 25 is receiving transmissions from the communication device 27 and repeating the transmissions back over the RF channel for the local network 20, the PCS system 25 can keep its transmitter active for a configurable amount of time after the received signal stops. The configurable amount of time can be known as the repeater drop-out delay and can be set on a per-channel basis. In an embodiment, the ability of the PCS system 25 to repeat packet data can be controlled by a separate configuration parameter (e.g., repeat packet data). The repeat packet data parameter permits the PCS system 25 to be enabled/disabled for packet data repeat separately from the mode controlling repeat of voice and/or supplementary data transmissions. In one embodiment, the repeat packet data configuration parameter applies across all channels of the PCS system 25.

When base station mode is selected as the RF configuration, the PCS system 25 can relay information between the interface 29 and the communication devices 27. The PCS system 25 can be acting like an RF MODEM between the communications hub 30 and the communication devices 27. The base station mode can be compatible with channels configured as either half-duplex or full-duplex. In the case of a full-duplex channel, the PCS system 25 can simultaneously send information from interface 29 to the communication devices 27, and from the communication devices 27 to the interface 29. In the case of a half-duplex channel, the PCS system 25 only allows information transfer in one direction at a time (e.g., to the interface 29 or from the interface 29). In one embodiment, if activity is being received by the PCS system 25 from both the communication devices 27 and the interface 29, then the activity from the interface 29 can take precedence.

In one embodiment, when operating in the base station mode, any required repeat functionality for the PCS system 25 can be provided by an external component 70 (e.g., a comparator or console) connected to the base unit 50. In base station mode, the administrator cannot enable local repeat options, and the communications hub cannot control repeat operations via interface 29. In system configurations for the PCS system 25 that depend on repeat functionality being provided by an external component 70, a backup mode in the base unit 50 can be used to provide repeat functionality should the external repeating component fail, thus allowing communication devices 27 to continue communicating with each other through a backup repeat mechanism. For this situation, the PCS system 25 supports fallback in-cabinet repeat functionality. The availability of the backup mode allows a base unit 50 to provide its own repeat functionality during the time that the external component 70 is not reachable or not functional.

The channel configurations can include a full-duplex mode, a half-duplex mode and a simplex mode. In one embodiment, the interface 29 can provide a full-duplex link (i.e., the interface 29 is able to send and receive information at the same time). However, the PCS system 25 has different configurations for RF communications that control whether the PCS system 25 can both transmit and receive with the communication devices 27 at the same time (full-duplex), or whether only one of transmit and receive with the communication devices 27 is enabled at a time (half-duplex). In one embodiment, the selection of the channel configuration can be performed for each RF channel supported by the PCS system 25.

A channel configured in full-duplex mode provides simultaneous operation of the PCS system's transmit and receive functionality to communicate with the communication devices 27. In some cases when using the full-duplex mode, there may be contention by two sources of voice/data for the transmit path between the PCS system 25 and the communication devices 27. For example, a transmission from the communications hub 30 may be delivered to the PCS system 25 via the interface 29 at the same time a transmission from a communication device 27 is being considered for local repeat operation. In these scenarios, the information chosen by PCS system 25 to be passed to the transmit path to the communication devices 27 is governed by a PTT Priority configuration parameter that controls which transmission can be transmitted.

In one embodiment, the PTT Priority configuration parameter can control the prioritization of signals to be sent via the transmitter of the PCS system 25. The PTT Priority configuration parameter can be set for: Wireline Priority—transmissions from the interface 29 has priority over RF repeat audio; Repeater Priority—transmissions from the RF channel has priority over transmissions from the interface 29; and Wireline=Repeat—whichever transmission starts first has priority over the other source. When competing signals bring these prioritization rules into effect, the prioritized signal is transmitted, and the non-prioritized signal is stopped at the PCS system 24. In one embodiment, no indication can be seen/heard by the originator of the "lower-priority" signal to indicate that their message was not successfully transmitted. Each channel can be independently configured to use one of these priority schemes.

A channel configured in half-duplex mode is limited to either transmitting to or receiving from the communication devices 27 at any given time. On a channel configured in half-duplex mode, if the PCS system 25 is receiving information/voice from both a communication device 27 for delivery to interface 29, and receiving information/voice from the interface 29 for delivery to the communication devices 27, then the PCS system 25 can determine which transmission has priority based on a predetermined configuration parameter. In one embodiment, the configuration parameter can be the PTT Priority configuration parameter that may be set to enable the information received from the interface 29 to take priority and be transmitted to the communication devices 27. In one embodiment, the PCS system 25 operates in a simplex mode where the transmit frequency is equal to the receive frequency. When operating in simplex mode, if a transmission is attempted at the same time as a signal is being received, the RF signals may interfere with each other. In one embodiment, to avoid interference when operating in simplex mode, the communication devices 27 may be configured such that they cannot transmit when they are receiving transmissions from the PCS system 25. In another embodiment, the user may permit the RF signals to interfere with one another when operating in simplex mode to provide the possibility that the "interfering" transmission may be received. In still another embodiment, the decision on whether to permit interfering signals can be based on a configuration parameter such as the PTT Priority parameter.

Figure 3:
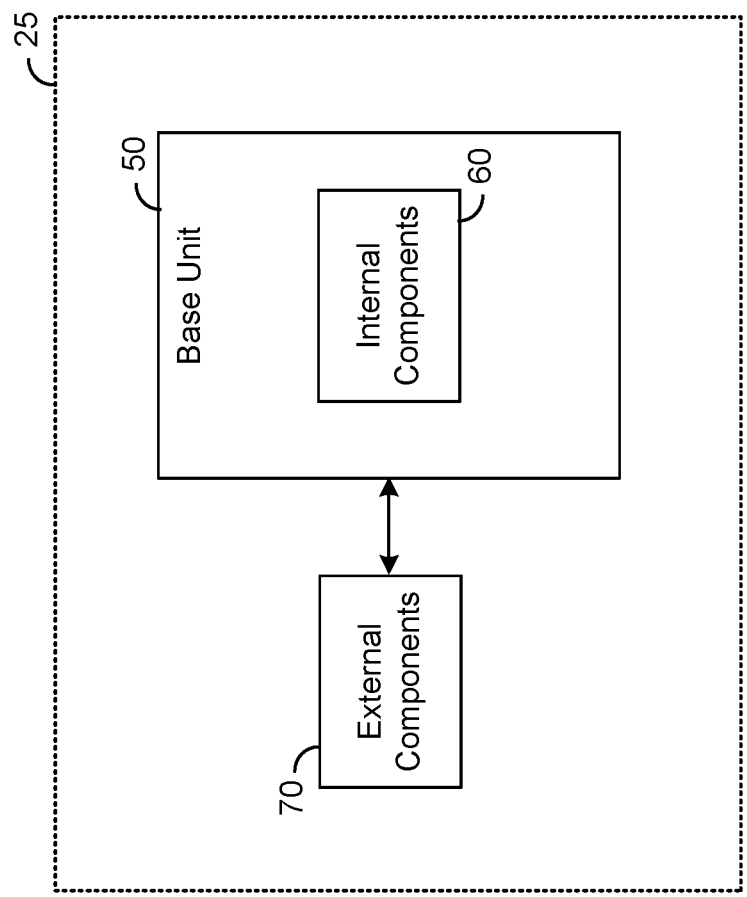
FIG. 3 is a block diagram showing an embodiment of a portable communication system.

FIG. 3 shows an embodiment of a simplified arrangement of the PCS system 25. The PCS system 25 can have a base unit 50 with one or more internal components or modules 60 and one or more external components or modules 70 connected to the internal components 60 of the base unit 50. As will described in greater detail below, the base unit 50 can have one or more terminals or connection points on the exterior of the base unit 50 to permit the external modules 70 to be connected to the base unit 50.

In one embodiment, the base unit 50 can be a lightweight, injection molded, resin case. The case can have two pieces connected by one or more hinging devices that permit the pieces to move relative to one another. The case can have a closed position where the two pieces are in contact with each other to prevent access to the interior of the case and provide weather-resistant seal to protect the internal components 60 from the surrounding environment. The case can also have an open position where one of the pieces is positioned, relative to the other piece, at an angle of about 90° or greater to permit access to the interior of the case. To insert, remove or reconfigure the internal components 60 of the base unit 50, the case can positioned in the open position and any covers or shields used to protect the internal components 60 when the case is in the open position can be removed to provide access to the internal components 60. The case can include one or more fasteners (e.g., padlockable hasps) to connect the two pieces when the case is in the closed position. In addition, the case can have a handle to permit a user to transport the case. The case may also have one or more external connection points or terminals, as discussed in detail below, that can be accessed under a removable cover on the case's side. In other embodiments, each external component 70 may be enclosed in a case similar to the case for the base unit 50.

When the base unit 50 of the PCS 25 is a case, as described above, the case can be operated in both the open position and the closed position. Similarly, when the external components 70 have a case, the case for the external components 70 can be operated in both the open position and the closed position. Regardless of whether the case(s) for the base unit 50 and the external components 70 are operated in the open position or the closed position, the PCS system 25 can provide the same functionality. In other words, there is no limitation on the operation of the PCS system 25 based on the open/closed configuration of the case(s) for the base unit 50 and/or the external components 70. When operating in the closed position, the case for the base unit 50 can be standing on its hinged side, allowing the case to provide better cooling efficiency. When operating in the open position, the case for the base unit 50 can be placed flat on its large surface to provide the best cooling capability. In one embodiment, the PCS system 25 can be operated in a closed state (i.e., the base unit 50 and any external components 70 are operated in the closed position) such that the PCS system 25 is weather-resistant.

In one embodiment, the PCS system 25 can be programmed for up to 16 different digital conventional RF channels for communicating RF signals. Any one of the programmed RF channels may be selected for use by the PCS system 25 at a given time. The currently active channel can be initialized via configuration parameters, and later be modified via commands from the communication hub 30 via the interface 29. In one embodiment, there is no physical channel selector switch on the PCS system 25. The PCS system 25 can be programmed to have all 16 channels defined, and then have each channel selectively enabled or disabled by an overriding configuration parameter on each channel. The predefining of the channels can make it easy to pre-configure the PCS system 25 with many channels, and then enable the desired channels as a situation warrants. The channel that is active upon start-up of the PSC system 25 can be configured to be either a particular channel, or the channel last active before the previous reset. In other embodiments, the PCS system 25 can include a channel selection device (e.g., a switch, keypad, touchscreen or a remote control device) that permits a user to manually select the active channel for the PCS system 25.

In addition, each channel can be configured with its own set of operational characteristics, including: transmit frequency; receive frequency; transmit power level; and monitor before transmit. The transmit frequency can be the RF frequency used to transmit communications by the PCS system 25 when active on the channel. The receive frequency can be the RF Frequency used to receive communications by the PCS system 25 when active on the channel. In one embodiment, the transmit and receive frequencies must be in the same RF band. The transmit power level can be the power output provided by the PCS system when transmitting on the channel. The configured power level (e.g., 1-20 watts) can be provided at the output of the PCS system internal transmit line. The internal transmit line can be connected to an antenna 68, internal duplexer 64, external duplexer 74, or a boost module 72. Each component connected between the internal transmit line and the antenna 68 can affect the output power of the signal on the internal transmit line by attenuating or boosting the signal. In one embodiment, the PCS system 25 can be configured to present an alarm if the measured RF transmit power differs from the programmed output power by a user-specified amount.

The monitor before transmit characteristic can be configured either on or off. The monitor before transmit functionality can be used when connected via interface 29 to communications hub 30. If the monitor before transmit is enabled, the PCS system 25 monitors the receive frequency and notifies the communications hub 30 about co-channel user activity. By monitoring the receive frequency, the communication hub 30 can pause data transmissions when other traffic exists on the channel, and to resume data transmissions when the other activity has ended.

In another embodiment, the PCS system 25 can have a set of LED indicators located inside the base unit 50 to provide a visual indication of the status and operation of the PCS system 25. In one embodiment, the state of the LEDs (e.g., off, on, blinking slow, blinking fast) indicates the current state of the function or operation being represented. The PCS system 25 can have two categories of LEDs: dedicated status LEDs and general status LEDs. The dedicated status LEDs can use labels to identify the corresponding functionality. For example, the dedicated status LEDs can include LEDs to indicate: status and activity regarding transmitting at interface 29; status and activity regarding receiving at interface 29; whether the PCS system 25 is currently repeating due to an initial configuration or received command from the communications hub 30; whether DC Power is normal, above/below an operational threshold, or approaching lower threshold; transmitter activity; receiver activity; whether the PCS system 25 is operating normally, or whether a pending warning or error exists; and whether the PCS system 25 is powered on. The dedicated status LEDs can also provide indications regarding Bluetooth operation and communications, Wi-Fi operation and communications or Ethernet operation and communications provided by PCS system 25.

The general status LEDs can use a combination of 3 or more LEDs (in on/off/blinking states) to provide information on more general states of the PCS system 25. The general states that can be indicated include: normal operating state (e.g., no warnings or errors); operating in fallback in-cabinet repeat mode; operating in service mode; operating in test mode; internal software image error; low transmit power (which can be a configurable threshold); temperature alarm (e.g., an RF power amplifier temperature alarm, which can be a configurable threshold). In another embodiment, the PCS system 25 can maintain an internal log of events that is viewable via the configuration/service software tool. The log can capture a large variety of notifications (e.g., status, errors and warnings) for troubleshooting. Problem indications seen on the status LEDs can have more detailed information available in the log. The configuration/service software tool can be used to retrieve logs that are saved in the PCS system 25, and can also monitor real-time activity of the PCS system 25 while it is actively processing RF transmissions.

In a further embodiment, the PCS system 25 can be an infrastructure device capable of supporting data services provided by the communications hub 30 including GPS location services, text messaging services, encryption services, and subscriber Over-The-Air Rekeying (OTAR). While PCS system 25 is not actively involved with data services, the PCS system 25 permits the data services to pass through, providing needed end-to-end delivery through its bearer services. When sending data originating from the communications hub 30, the PCS system 25 can be configured to send a certain duration of idle packets after the last communication hub-originated data message is sent. The configurable wireline data drop-out delay prevents rapid key/dekey sequences of the PCS system 25 during a data session. The PCS system 25 can also be configured to provide local repeat functionality for packet data services, which can be useful in remote deployment scenarios where communication devices need to pass data to each other without involvement of the communication hub 30.

Figure 5:
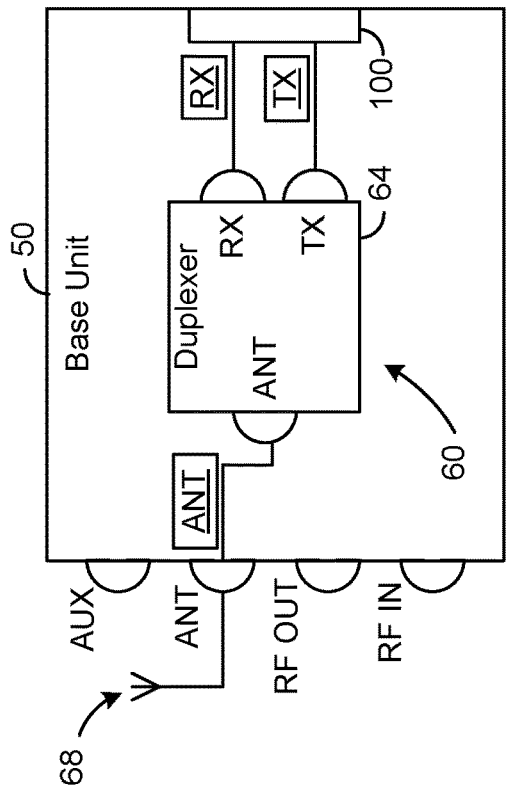
FIGS. 4-5 are block diagrams showing embodiments of a base unit of the portable communication system of FIG. 3.
Figure 4:
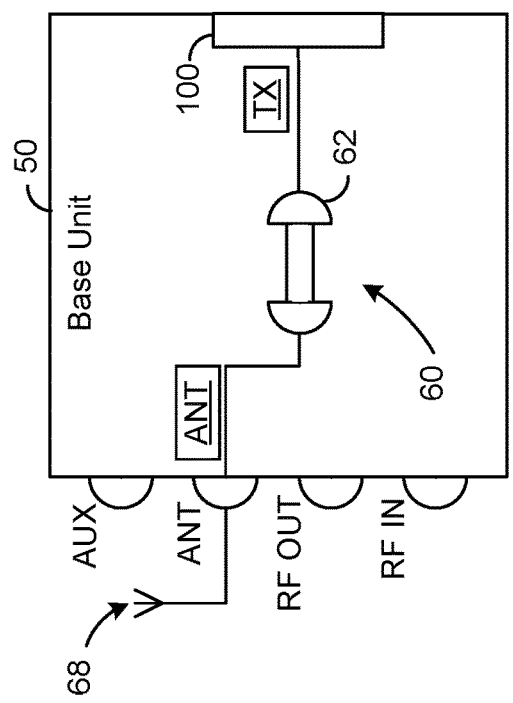

FIGS. 4 and 5 show different embodiments of some of the internal components 60 of the base unit 50. The base unit 50 can include an auxiliary terminal (AUX), an antenna terminal (ANT), an RF output terminal (RF OUT) and an RF input terminal (RF IN) on the exterior of the base unit 50. In other embodiments, the base unit 50 can also include terminals for network connections (e.g., V.24 input or LAN input), power connections (e.g., AC input or DC input) and USB (universal serial bus) connections. Each of the terminals can be configured such that an external line or connection (from an external component) can be coupled to an exterior portion of the terminal and an internal line or connection (e.g., a wire, cable or other suitable connection mechanism) can be coupled to an interior portion of the terminal located in the interior portion of the base unit 50. In one embodiment, each of the terminals can provide a weather-resistant connection to the base unit 50 in order to permit the PCS system 25 to operate in a variety of different weather conditions and environments.

FIG. 4 shows the base unit 50 with internal components 60 to provide simplex operation. To provide simplex operation, the internal components 60 can include an adapter 62 that couples an internal transmit line TX to an internal antenna line ANT. In one embodiment, the adapter 62 can be a female-female adapter, but other types of adapters are possible in other embodiments. The internal antenna line ANT can be coupled to the antenna terminal ANT to which an antenna 68 can be connected. FIG. 5 shows the base unit 50 with internal components 60 to provide duplex operation (e.g., full-duplex or half-duplex). To provide duplex operation, the internal components 60 include a duplexer 64 with a receive terminal RX that is coupled to an internal receive line RX, a transmit terminal TX that is coupled an internal transmit line TX and an antenna terminal ANT that is coupled to an internal antenna line ANT. The internal antenna line ANT can be coupled to the antenna terminal ANT of the base unit 50 to which an antenna 68 can be connected. The internal receive line RX and the internal transmit line TX can be coupled to corresponding transmit and receive terminals (not shown) on an RF controller 100 that is connected to the interface 29 (and communications hub 30).

In one embodiment, the PCS system 25 can operate on either AC or DC power at one of 12 VDC, 120 VAC, or 220 VAC. The PCS system 25 can provide warnings when the supply voltage deviates from acceptable limits. The providing of warnings can include providing visual indications. In one embodiment, the thresholds used to drive high/low voltage warning indications can be configurable. In one embodiment, an external battery pack can be connected to the PCS system 25 to provide DC power to the PCS system 25 when an AC connection is not available. The external battery pack can have an enclosure with batteries, a battery voltage indicator and a DC input/output connector. In one embodiment, a fully charged, new battery pack can power the PCS system 25 (at a 50% transmit duty cycle) for 5 hours and can be recharged in approximately 10 hours from a fully-discharged state. In other embodiments, the battery pack can power the PCS system 25 for more or less than 5 hours and may be recharged in more or less than 10 hours. An AC to DC external battery charger can be used to charge the internal batteries of the battery pack from an AC power source.

In another embodiment, an adaptive power control scheme can be used to allow communication devices 27 to operate at a lower transmit power, when possible, in order to extend the battery life in the communication devices 27. At the end of communication device transmissions, the PCS system 25 can send back signal quality information (including signal strength and Bit Error Rate) to the communication devices 27, permitting the communication devices 27 to determine whether operation at a different transmit power rate would continue to provide a high-quality signal, and gain battery savings. Each communication device 27 can adjust its power level accordingly as the communication device 27 moves into better/poorer coverage conditions, and receives updates from the PCS system 25 based on its previous transmission.

Figure 6:
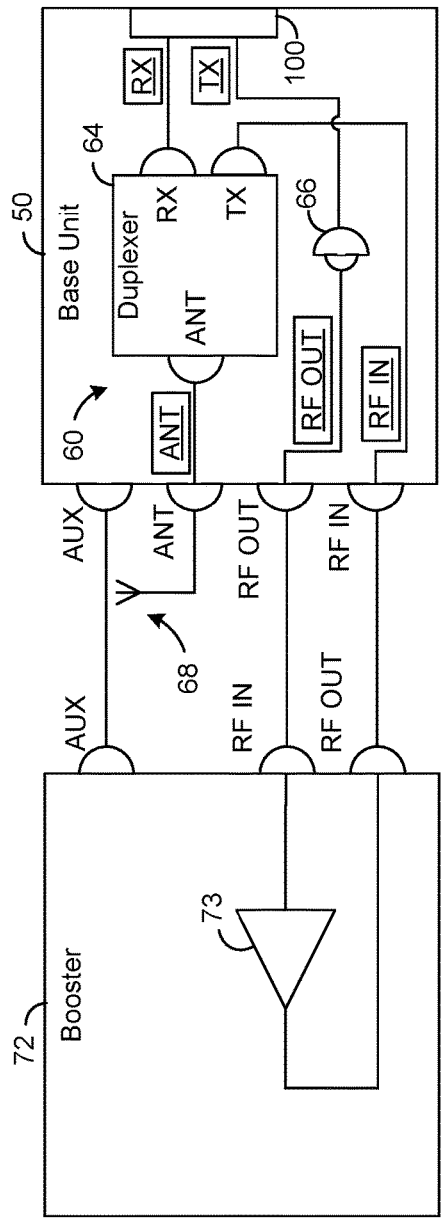
FIGS. 6-8 are block diagrams showing embodiments of the portable communication system of FIG. 3.
Figure 7:
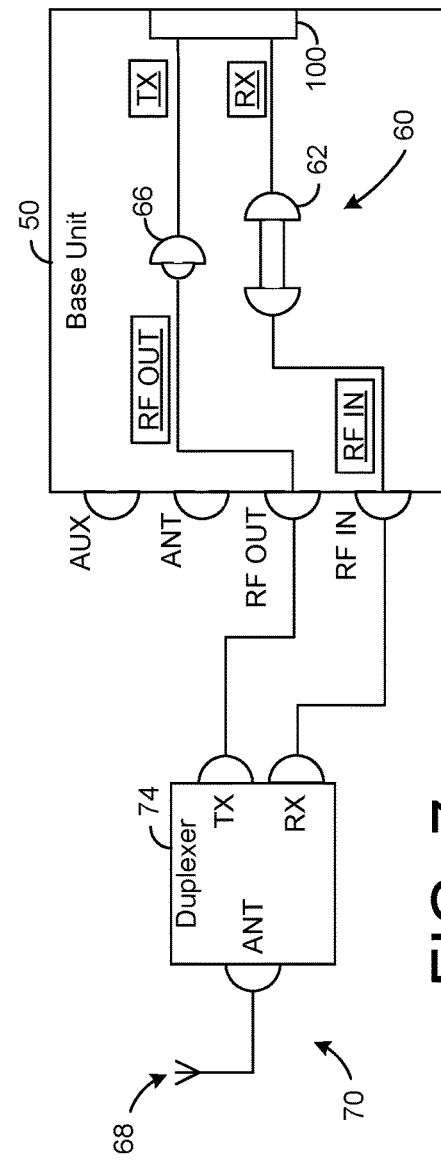
Figure 8:
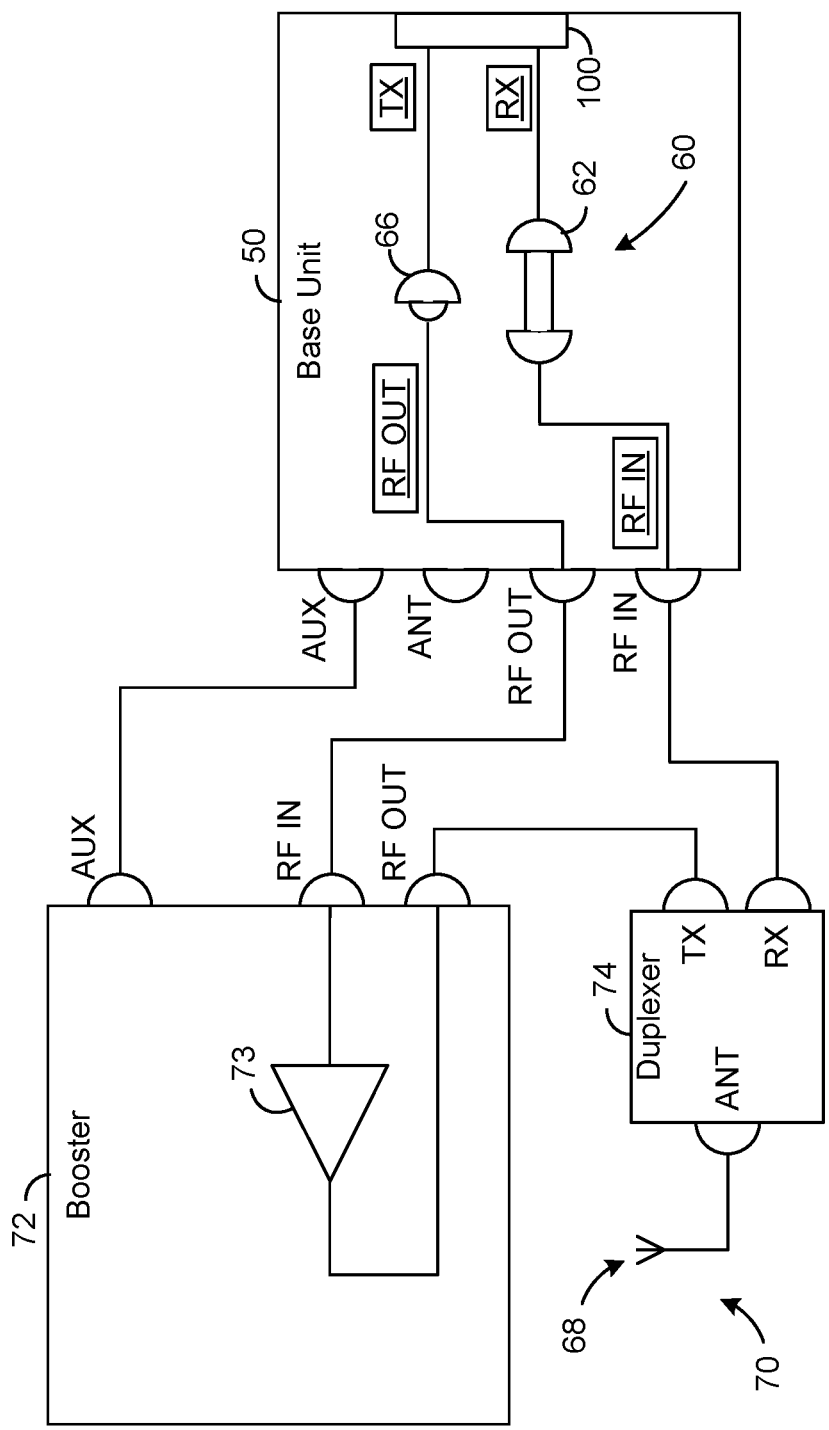

FIGS. 6-8 show different embodiments of the external components 70 that can be coupled to the base unit 50 and the internal components 60. FIG. 6 shows the base unit 50 coupled to external components 70 to provide boost operation. To provide boost operation, the external components 70 can include a boost module 72 having boost circuitry 73.

In one embodiment, the internal components 60 of the base unit 50 can provide about 20 watts of power at the input to the duplexer 64. As the signal traverses the duplexer 64, a drop in signal strength can occur. The drop in signal strength can be dependent on the frequency band and the type of duplexer 64 used in the base unit 50. If a higher output power for transmission is required from the base unit 50, an external booster (e.g., boost module 72) can be connected to the base unit 50 as described in detail below. The boost module can be used with any of the PCS system deployment configurations (discussed above) that provide transmit capability (e.g., the boost module 72 cannot be used with satellite receiver mode). The boost module 72 can be utilized with the standard base unit configurations discussed above, and adds an additional enclosure (same as that used for the base unit 50) which provides the additional transmit power. The base unit 50 and the boost module 72 can be connected via an external connection or line (e.g., a wire, cable or other suitable connection mechanism). In one embodiment, an output power of about 50 watts can be provided when using the boost module 72. During configuration of the PCS system 25 in a booster configuration, the service/configuration software tool automatically reduces the base unit output power and pre-sets base unit filtering parameters to protect the base unit 50 and the boost module 72 from damage due to a signal/power overload. The service/configuration software tool automatically makes adjustments to several parameters of the PCS system configuration to simplify the task of correctly programming the PCS system 25 in a booster configuration.

Referring back to FIG. 6, the boost module 72 can include an auxiliary terminal (AUX), an RF output terminal (RF OUT) and an RF input terminal (RF IN) on the exterior of the boost module 72. The base unit 50 can include a duplexer 64 with a receive terminal RX that is coupled to an internal receive line RX, a transmit terminal TX that is coupled an internal RF input line RFIN and an antenna terminal ANT that is coupled to an internal antenna line ANT. The internal antenna line ANT can be coupled to the antenna terminal ANT of the base unit 50 to which an antenna 68 can be connected. In addition, the internal transmit line TX can be coupled to the internal RFOUT line by a connector 66. In one embodiment, the connector 66 can provide a male-female connection, but other types of connections are possible in other embodiments. To couple the boost module 72 to the base unit 50, the auxiliary terminal AUX of the boost module 72 can be connected to the auxiliary terminal AUX of the base unit 50, the RF input terminal RF IN of the boost module 72 can be connected to the RF output terminal RF OUT of the base unit 50 and the RF output terminal RF OUT of the boost module 72 can be connected to the RF input terminal RF IN of the base unit 50. In operation, a transmit signal received at the internal transmit line TX passes to the internal RF output line RF OUT, then to the RF output terminal RF OUT of the base unit 50, then to the RF input terminal RF IN of the boost module 72, then to the boost circuitry 73 (which boosts the power of the transmit signal), then to the RF output terminal RF OUT of the boost module 72, then to the RF input terminal RF IN of the base unit 50 to the transmit terminal TX of the duplexer 64. A receive signal received at the internal receive line RX passes to the receive terminal RX of the duplexer 64.

FIG. 7 shows the base unit 50 coupled to external components 70 to provide duplex operation. To provide duplex operation, the external components 70 can include an external duplexer 74. The duplexer 74 has a receive terminal RX that is coupled to the RF input terminal RF IN of the base unit 50, a transmit terminal TX that is coupled the RF output terminal RF OUT of the base unit 50 and an antenna terminal ANT that is coupled to an antenna 68. The base unit 50 can have the internal transmit line TX coupled to the internal RFOUT line by a connector 66 and the internal receive line RX coupled to the internal RF input line RFIN by an adapter 62. In operation, a transmit signal received at the internal transmit line TX passes to the internal RF output line RFOUT, then to the RF output terminal RF OUT of the base unit 50, and then to the transmit terminal TX of the external duplexer 74. A receive signal received at internal receive line RX passes to the internal RF input line RFIN, then to the RF input terminal RF IN of the base unit 50 and then to the receive terminal RX of the external duplexer 74.

FIG. 8 shows the base unit 50 coupled to external components 70 to provide both boost operation and duplex operation. To provide boost operation, the external components 70 can include a boost module 72 having boost circuitry 73 as described above with respect to FIG. 6. To provide duplex operation, the external components 70 can include an external duplexer 74 as described above with respect to FIG. 7. The base unit 50 can have the internal transmit line TX coupled to the internal RFOUT line by a connector 66 and the internal receive line RX coupled to the internal RF input line RFIN by an adapter 62. To couple the boost module 72, the external duplexer 74 and the base unit 50, the auxiliary terminal AUX of the boost module 72 can be connected to the auxiliary terminal AUX of the base unit 50, the RF input terminal RF IN of the boost module 72 can be connected to the RF output terminal RF OUT of the base unit 50, the RF output terminal RF OUT of the boost module 72 can be connected to the transmit terminal TX of the external duplexer 74 and the RF input terminal RF IN of the base unit 50 can be connected to the receive terminal RX of the external duplexer 74. In operation, a transmit signal received at the internal transmit line TX passes to the internal RF output line RFOUT, then to the RF output terminal RF OUT of the base unit 50, then to the RF input terminal RF IN of the boost module 72, then to the boost circuitry 73 (which boosts the power of the transmit signal), the to the RF output terminal RF OUT of the boost module 72 and then to the transmit terminal TX of the external duplexer 74. A receive signal received at internal receive line RX passes to the internal RF input line RFIN, then to the RF input terminal RF IN of the base unit 50 and then to the receive terminal RX of the external duplexer 74.

Figure 9:
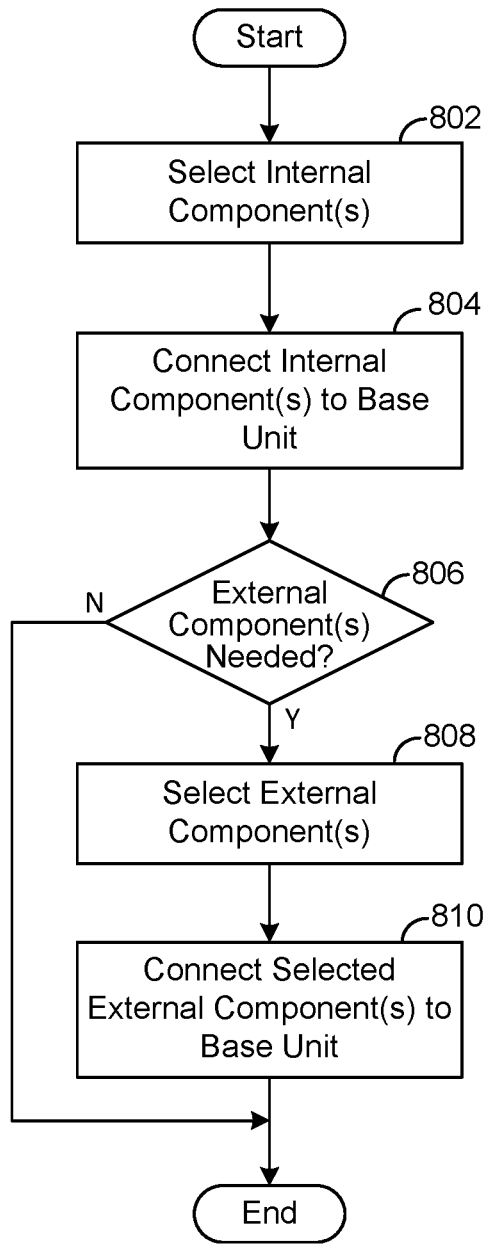
FIG. 9 shows an embodiment of a process for configuring a portable communication system.

FIG. 9 shows an embodiment of a process for configuring a PCS system 25. The process begins with a user selecting the desired operation for the base unit 50 and the corresponding internal components 60 (step 802). When selecting the internal components for the base unit 50, the user may have to decide on the internal components 60 that are required for the desired operation and how the internal components 60 should be configured to achieve the desired operations (e.g., selections for configuration parameters, internal wiring connections, etc.). Next, the user can connect the internal components 60 to the base unit 50 (step 804).

The user can connect the internal components 60 to the base unit 50 by inserting the required internal components 60 into the base unit 50 and making the necessary internal connections for the selected operation including coupling internal connections to a module or coupling internal connections to an adapter 62 or a connector 66 in order to connect corresponding internal connections, as required, by the selected internal components 60 and the corresponding configuration of the base unit 50. In addition, the configuration/service software tool can be used to set the corresponding configuration parameters for the internal components 60 and base unit 50.

After connecting the internal components 60, a determination is made as to whether external components 70 are needed (step 806). If no external components 70 are needed, the base unit 50 is configured properly and the process ends. If external components 70 are needed, the externals components 70 are selected (step 808) and connected to the base unit 50 (step 810) using external connections as shown in FIGS. 6-8 and the process ends. If the configuration for the PCS system 25 has to be changed, the process of FIG. 9 can be repeated with the current internal components 60 and external components having to be disconnected from the corresponding internal/external connections and removed from the base unit 50 before the selected internal components 60 and external components 70 can be connected to the base unit 50.

As discussed above, the PCS system 25 can support a variety of operational channel modes (e.g., simplex, half-duplex, full-duplex), and a variety of hardware configurations (e.g., internal duplexer 64, external duplexer 74, no duplexer; internal power amplifier, external booster module 72, etc.). To avoid routing the PCS system's transmitted signal back into the receiver for the PCS system 25, there should be a degree of isolation between the transmit and receive RF paths for each configuration of the PCS system 25. Several different techniques can be used accomplish the isolation between the transmit and receive paths. For example, in full-duplex operation utilizing a common antenna to transmit (TX) and receive (RX), a duplexer is typically employed to provide the needed isolation between the TX/RX paths. For a half-duplex configuration, if separate transmit and receive antennas are used, a sufficient physical antenna separation is required to provide the needed isolation or if a common antenna is used for transmit and receive, then the transmit/receive isolation must be provided by either a duplexer, or other circuitry that can break connection to the receive path during a transmission. In one embodiment, the base unit 50 of the PCS system 25 has internal circuitry used to isolate transmit and receive paths. When an external boost module 72 is connected to the base unit 50, the base unit 50 can provide control for an external antenna switch to provide the needed isolation. For a simplex configuration, the PCS system 25 can utilize internal circuitry in the base unit 50 to isolate the transmit and receive paths. If the PCS system 25 utilizes a boost module 72, the base unit 50 provides control for an external antenna switch located in the boost module 72 that keeps the boost module 72 in-line during a transmission, but bypasses the boost module 72 during receive. The external auxiliary port (AUX) of the base unit 50 can be configured to act as the control mechanism for an external antenna switch, as needed, for some of the scenarios described above.

Embodiments within the scope of the present application include program products with machine-readable media for carrying or having machine-executable instructions or data structures stored thereon. Machine-readable media can be any available non-transitory media that can be accessed by a general purpose or special purpose computer or other machine with a processor. By way of example, machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Combinations of the above are also included within the scope of machine-readable media. Machine-executable instructions include, for example, instructions and data which cause a general purpose computer, special purpose computer, or special purpose processing machine to perform a certain function or group of functions. Software implementations could be accomplished with standard programming techniques, with rule based logic and other logic to accomplish the various connection steps, processing steps, comparison steps and decision steps.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. An RF (radio frequency) communication system comprising:
    a plurality of RF communication devices;
    a communication hub;
    a digital repeater system configured to facilitate RF communications between the plurality of RF communication devices and the communication hub, the digital repeater system comprising:
        a base unit, the base unit having an interior portion and an exterior portion opposite the interior portion;
        a plurality of internal connections positioned in the interior portion of the base unit, the plurality of internal connections comprising a plurality of first internal connections and a plurality of second internal connections, each first internal connection of the plurality of first internal connections being configured to communicate an RF signal;
        a plurality of terminals positioned on the exterior portion of the base unit and extending to the interior portion of the base unit, the plurality of terminals comprising a plurality of first terminals and a plurality of second terminals, each first terminal of the plurality of first terminals being configured to communicate an RF signal and coupled to a corresponding first internal connection of the plurality of first internal connections, and at least two second terminals of the plurality of second terminals being in communication with the communication hub and coupled to at least two corresponding second internal connections of the plurality of second internal connections;
        an internal RF module positioned in the interior portion of the base unit and coupled to one or more first internal connections of the plurality of first internal connections and one or more second internal connections of the plurality of second internal connections, the internal RF module configured to provide a predetermined RF communication mode between the digital repeater system and the plurality of RF communication devices, wherein the internal RF module is configured to be replaced by a new internal RF module by disconnecting the one or more first internal connections and the one or more second internal connections and removing the internal RF module and inserting the new internal RF module and coupling the one or more first internal connections and the one or more second internal connections to the new internal RF module; and
        at least one external RF module coupled to at least one first terminal of the plurality of first terminals of the base unit, the at least one external RF module being coupled to the internal RF module via the at least one first terminal and the corresponding one or more first internal connections.

2. The system of claim 1, wherein the at least one external RF module comprises at least one of a boost module or a duplexer.

3. The system of claim 2, wherein:
    the internal RF module comprises a duplexer, the duplexer being connected to a receive terminal of the at least two second terminals by a corresponding second internal connection of the at least two second internal connections; and
    the external RF module comprises the boost module, the duplexer is connected to the boost module, the boost module configured to boost a signal from the communications hub provided at a transmit terminal of the at least two second terminals.

4. The system of claim 2, wherein:
    the internal RF module comprises at least one of an adapter or a connector; and
    the external RF module comprises the duplexer, the duplexer being connected to the at least two second terminals by the internal RF module.

5. The system of claim 4, wherein the at least one external RF module comprises an antenna coupled to the duplexer.

6. The system of claim 2, wherein:
    the internal RF module comprises at least one of an adapter or a connector; and
    the external RF module comprises the duplexer and the boost module, the duplexer connected to a receive terminal of the at least two second terminals by the internal RF module and the boost module connected to a transmit terminal of the at least two second terminals by the internal RF module.

7. The system of claim 6, wherein the boost module is connected to the duplexer by an external connection, the boost module configured to boost a signal from the communications hub for transmission by the duplexer.

8. The system of claim 6, wherein the at least one external RF module comprises an antenna coupled to the duplexer.

9. The system of claim 1, wherein the base unit has a closed position that provides a weather-resistant seal to protect the interior portion of the base unit from the surrounding environment, wherein the internal RF module or the new internal RF module is operable when the base unit is in the closed position.

10. The system of claim 1, wherein the at least one external RF module comprises an antenna coupled to the at least one first terminal of the plurality of first terminals.

11. The system of claim 1, wherein the internal RF module comprise at least one of an adapter or a connector and the new internal RF module is a duplexer.

12. The system of claim 1, wherein the communication hub is at a separate location from the digital repeater system and connected to the digital repeater system by a network.

13. A method for configuring a portable RF (radio frequency) communication system comprising:
   selecting at least one internal RF component for a base unit, the selected at least one internal RF component being configured to provide a predetermined RF communication mode for a plurality of RF communication devices in communication with the portable RF communication system;
   connecting the selected at least one internal RF component to the base unit by at least one internal connection of the base unit; determining whether at least one external RF component is needed for the portable communication system to provide RF communication with the plurality of RF communication devices;
   selecting the at least one external RF component in response to a determination that at least one external RF component is needed, the at least one external RF component configured to enable RF communication with the plurality of RF communication devices, wherein the at least one external RF component is at least one of a booster or a duplexer; and
   connecting the selected at least one external RF component to a plurality of RF terminals on the exterior surface of the base unit by a plurality of external connections, each external connection of the plurality of external connections configured to communicate an RF signal;
   further comprising receiving a signal at a controller of the base unit, wherein the controller has a receive terminal and a transmit terminal;
   wherein: the connecting the selected at least one internal RF component includes connecting at least one of an adapter or a connector to each of the receive terminal and the transmit terminal by the at least one internal connection; and the connecting the selected at least one external RF component includes:
      connecting a duplexer to a first RF terminal of the plurality of RF terminals, wherein the first RF terminal is connected to the at least one or an adapter or a connector for the receive terminal by the at least one internal connection;
      connecting a boost module to a second RF terminal of the plurality of RF terminals,
      wherein the second RF terminal is connected to the at least one or an adapter or a connector for the transmit terminal by the at least one internal connection; and
      connecting the boost module to the duplexer by an intermediate connection, the boost module configured to boost a signal provided to the transmit terminal by the controller.

14. The method of claim 13, further comprising selecting a first configuration parameter, and a second configuration parameter for the portable RF communication system, wherein the first configuration parameter corresponds to a mode of operation for the portable RF communication system and the second configuration parameter corresponds to a type of RF communication between the portable RF communication system and the plurality of RF communication devices.

15. The method of claim 14, wherein:
   the first configuration parameter comprises one of:
      a first mode configured to exchange communications between a communications hub and the plurality of RF communication devices,
      a second mode configured to repeat messages between the plurality of RF communication devices, or
      a third mode configured to exchange communication between a communications hub and the plurality of RF communication devices and to repeat messages between the plurality of RF communication devices, and
   the second configuration parameter comprises one of a full-duplex mode, a half-duplex mode or a simplex mode.

16. The method of claim 13, further comprising disconnecting an internal RF component coupled to the base unit prior to connecting the selected at least one internal RF component.

* * * * *